United States Patent
Degani et al.

(10) Patent No.: US 6,680,212 B2
(45) Date of Patent: Jan. 20, 2004

(54) METHOD OF TESTING AND CONSTRUCTING MONOLITHIC MULTI-CHIP MODULES

(75) Inventors: Yinon Degani, Highland Park, NJ (US); Thomas Dixon Dudderar, Chatham, NJ (US); King Lien Tai, Berkeley Heights, NJ (US)

(73) Assignee: Lucent Technologies INC, Murray Hill, NJ (US)

( * ) Notice: Subject to any disclaimer, the term of this patent is extended or adjusted under 35 U.S.C. 154(b) by 0 days.

(21) Appl. No.: 09/879,759

(22) Filed: Jun. 12, 2001

(65) Prior Publication Data

US 2002/0081755 A1 Jun. 27, 2002

Related U.S. Application Data

(60) Provisional application No. 60/257,702, filed on Dec. 22, 2000.

(51) Int. Cl.[7] .................................................. H01L 21/66
(52) U.S. Cl. ................................. 438/14; 257/778; 438/15
(58) Field of Search ......................................... 438/14, 15

(56) References Cited

U.S. PATENT DOCUMENTS

| 4,417,297 A | * 11/1983 | Oyama et al. ............... 361/412 |
| 5,770,300 A | * 6/1998 | Okamoto et al. ........... 428/209 |
| 6,002,178 A | * 12/1999 | Lin .............................. 257/778 |
| 6,137,174 A | * 10/2000 | Chiang et al. ............... 257/734 |
| 6,249,052 B1 | * 6/2001 | Lin .............................. 257/737 |
| 6,297,551 B1 | * 10/2001 | Dudderar et al. ........... 257/723 |

* cited by examiner

Primary Examiner—David Nelms
Assistant Examiner—Thao P Le
(74) Attorney, Agent, or Firm—Peter V. D. Wilde

(57) ABSTRACT

The specification describes electrical testing strategies for multi-chip modules (MCMs). The MCMs are fabricated on double sided substrates, which are then solder bump bonded to a motherboard to form a BGA package. Untested chips are attached permanently to one side of the substrate to form a partially completed MCM package (PCMP), and the PCMPs are tested. PCMPs that pass are then completed by assembling known good die on the other side of the substrate.

14 Claims, 2 Drawing Sheets

METHOD OF TESTING AND CONSTRUCTING MONOLITHIC MULTI-CHIP MODULES

RELATED APPLICATIONS

This application claims the benefit of provisional application No. 60/257,702 filed Dec. 22, 2000, which is assigned to the assignee of the present invention and which is incorporated herein by reference.

FIELD OF THE INVENTION

This invention relates to fabrication of semiconductor integrated circuit (IC) devices, and more specifically to fabrication and testing of multi-chip modules.

BACKGROUND OF THE INVENTION

Electrical testing of IC devices is a significant component of the cost of the final IC product. Considerable development and test tool investment is made in this aspect of IC manufacture. In Multi-Chip-Module (MCM) packaging, the test strategy is especially critical. Testing the final product, the conventional approach generally favored from the standpoint of both cost and reliability, is not optimum for MCM products since the final yield is a multiple of the yield for each individual die in the MCM package. For example, if each of the dies in the package has a yield of 95%, an MCM with 3 dies will have a yield of only 85.7%. Thus in some IC device packaging, notably MCM packaging, it is highly desirable to fully test the dies before assembly to identify the Known Good Dies (KGD). This typically involves both electrical functionality tests, and often aging or burn-in tests. Burn-in tests are especially important for memory dies, which typically exhibit a 1–5% burn-in failure rate over dies that have been only functionally tested. However, burn-in tests require robust and reliable electrical probe connections. Moreover, it is also useful to test these devices after the package interconnections are made. This provides not only the robust electrical contacts just mentioned but also allows the integrity of the package interconnections to be verified. This leaves a choice between providing only KGD prior to assembly, or assembling relatively untested devices and testing them after assembly. The first choice is costly since KGD are inherently expensive. The second choice involves the risks outlined earlier, i.e. the need to discard an MCM package with several good chips due to one defective chip.

Thus there exists in the technology a choice between assembling only known good die (KGD) or assembling largely untested chips and testing after assembly. Both choices have drawbacks.

STATEMENT OF THE INVENTION

We have developed an IC testing approach for MCM devices that marries the advantages of both of the choices just described. When, as usually the case, there are one or more IC chips of relatively low value but relatively high probability of failure that can easily be tested in packaged form, that selected device can be packaged first and tested. The IC chip or chips of relatively high value are fully tested prior to packaging and are then integrated into the partially packaged MCM. In the preferred embodiment, the relatively untested chips that are assembled first into the package are located on one side of an interconnect substrate and the later assembled chips are located on the other side of the interconnect substrate.

DETAILED DESCRIPTION

Figure 1:
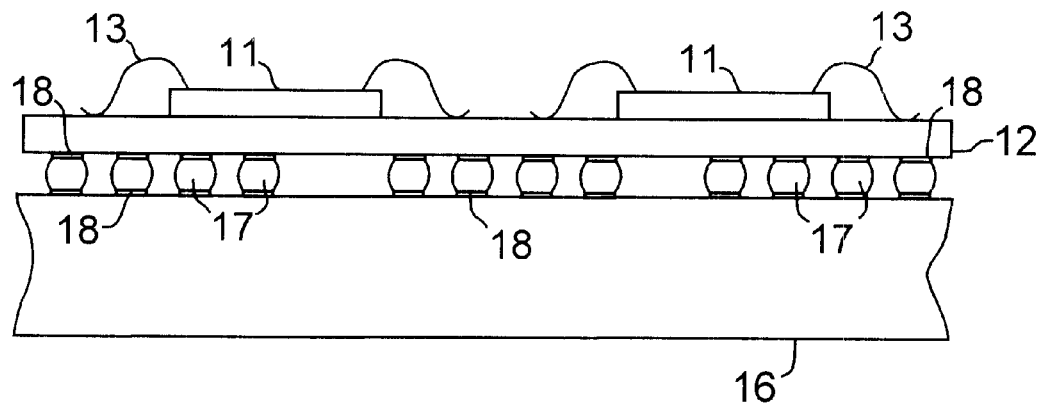
FIG. 1 is a schematic view of one embodiment of a standard BGA IC package.

A conventional BGA package is shown in FIG. 1. IC chip 11 is die bonded to interconnect substrate 12. The IC chip is typically a silicon chip but may also comprise a III–V semiconductor chip, e.g. of GaAs or InP, for high speed transistors or photonic devices. The interconnect substrate 12 is typically a circuited laminate made of standard epoxy or other suitable material. Bond pads on the IC chip are interconnected to bond pads on the interconnect substrate by wire bonds 13. The substrate 12 is interconnected to the next board level, typically a motherboard 16, by the array of solder balls 17. The solder balls are usually attached to BGA bond pads 18. FIG. 1 shows two chips mounted on substrate 12, to form a Multi-Chip Module (MCM), but as understood in the art, the more conventional BGA contains a single chip. Also there may be more than two chips mounted in similar fashion. The wire bonds in this view suggest a single row of in-line wires, but multiple rows of wire bonds, in-line or staggered, are commonly used. This package design, with wire bonds to the IC chip, and large ball bonds to the next interconnect level, is robust and inexpensive. However, as recognized by those skilled in the art, the chip density, and the density of I/O interconnections, in this package is modest.

Figure 2:
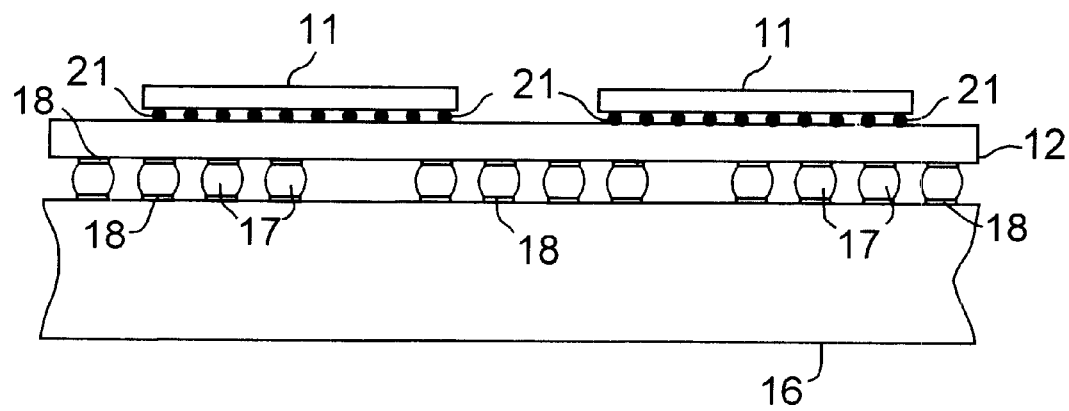
FIG. 2 is a schematic view of a second embodiment of a standard BGA package.

FIG. 2 is a similar BGA package wherein the IC chips 11 are flip-chip bonded to substrate 12 using microbumps 21.

We have recognized that state of the art IC chips can be made thin enough that they can be mounted in the space between the board 12 and the support substrate 16. Devices based on this concept are described and claimed in our U.S. application Ser. No. 09/528,882, filed Mar. 20, 2000, which application is incorporated herein by reference.

Figure 3:
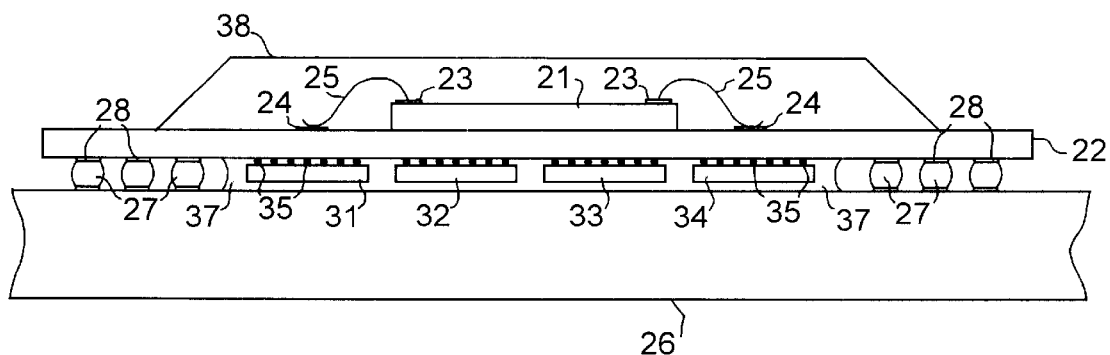
FIG. 3 is a schematic representation of one embodiment of a double-sided flexible substrate multi-chip IC package used in the test strategy of the invention.

For convenience in this description the space between the board 12 and the support substrate 16 will be referred to herein as the "BGA gap". A BGA package designed according to the application referenced above is shown in FIG. 3, where the IC chip is designated 21 and is die bonded to interconnect substrate 22 as in FIG. 1. Bond pads 23 on the IC chip are interconnected to bond pads 24 on the interconnect substrate by wire bonds 25. The substrate 22 is interconnected to motherboard 26 by solder balls 27 and BGA bond pads 28. Attached to the underside of the substrate 22, in the BGA gap, is an array of IC chips 31–34. Each of the array of IC chips is flip-chip bonded to the underside of substrate 22 using solder bumps 35. Solder bumps 35 are typically provided with under bump metallization (not shown). Substrate 22 therefore supports a hybrid of wire bonded chips and solder bonded flip-chips.

In a preferred form of this device the wire bonded IC chip 21 is a logic/controller IC chip and the IC chips 31–34 in the array on the underside of substrate 22 are memory IC chips. As shown, the standoff between motherboard 26 and substrate 22, i.e. the BGA gap thickness, is sufficient to accommodate the thickness of the IC chips 31–34. In a typical BGA package, this standoff distance is approximately 15–25 mils. The usual wafer thickness for IC devices is 26–30 mils. Thus the wafers may be thinned prior to dicing to reduce the IC chip thickness to below the BGA standoff dimension. Thinning of IC chips is conventional, and in state of the art IC technology is performed routinely. IC chips are typically thinned to 10–15 mils.

Figure 4:
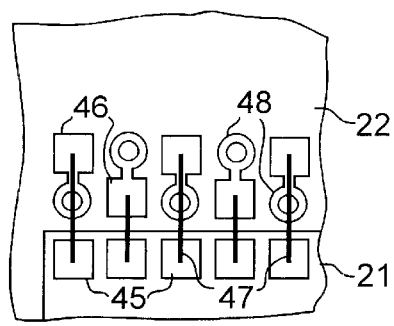
FIG. 4 is a plan view of a portion of the substrate of FIG. 3.

For clarity, the vias are not shown in FIG. 3, but are illustrated in FIG. 4. In FIG. 4, a portion of IC chip 21 is shown, as well as a portion of substrate 22 on which it is mounted. IC chip 21 may be die bonded or otherwise affixed to substrate 22. An array of wire bond pads 45 is shown along the edge of IC chip 21. A corresponding array of wire bond pads 46 are formed on substrate 22. Wire bond interconnections are shown at 47. In this figure the wire bond pads on substrate 22 are shown in two rows to illustrate the several alternative arrangements that may be used for the wire bond sites. The pads on IC chip 21 can also be arranged in more than one row, and staggered and overlapped so that, e.g., 200 pads, each having a 50 mm square, can be accommodated along a chip side of substantially less than 10,000 mm.

Associated with the bond pad sites 46 are vias 48 that interconnect the wire bond pads 46 to the underside of substrate 22. While not shown, it will be understood by those skilled in the art that printed circuits are provided on substrate 22. The printed circuits interconnect IC chips 31–34, IC chip 31, and BGA balls 27. It will also be understood that a wide variety of interconnection circuits may be used for the invention. These circuits may interconnect some of the wire bond pads 46 together, in which case each wire bond pad will not require an associated via. The vias are shown as situated along the edge of IC chip 21 but may alternatively occupy any of the substrate area on the top side of substrate 22. Likewise the printed circuits on the upper and lower sides of substrate 22 may extend over the entire available surface. This large surface area adds significantly to the design flexibility of the interconnection patterns. It is also practical to add interconnection circuits to substrate 26. Moreover, it should be understood that either or both of substrate 22 motherboard 26 can be multilevel printed circuit boards.

The arrangement described above and shown in FIG. 3, i.e. with one or more IC chips wire bonded to the top surface of the substrate and one or more IC chips flip-chip bonded in the BGA gap, represents one MCM arrangement. However, in principle IC chips can be thinned to even smaller dimensions, and with the current development of fine wire bond techniques with relatively flat profiles, one or more wire bonded IC chips may be mounted in the BGA gap. Another very practical alternative is to flip-chip bond IC chips on the top of the substrate. This design is shown in FIG. 5, and has additional features of interest.

Figure 5:
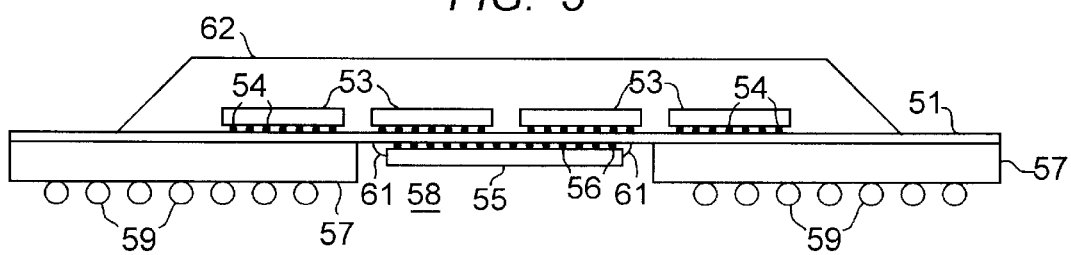
FIG. 5 is a schematic representation of a second embodiment of the double-sided flexible substrate multi-chip IC package used in the test strategy of the invention.

The design of FIG. 5 employs a flexible substrate with IC chips mounted on both sides of the flexible substrate. This design is described and claimed in U.S. patent application Ser. No. 09/498,005 filed Feb. 4, 2000, which is incorporated herein by reference. In FIG. 5, flexible substrate 51 carries a plurality of IC memory chips 53 bonded with solder bumps 54 to the top of the substrate. A logic IC chip 55 is bonded with solder bumps 56 to the underside of substrate 51. The flexible substrate has printed circuit interconnections (not shown for clarity) on both sides of the flexible substrate providing interconnections for the IC chips. The flexible substrate 51 is bonded to a support substrate 57 which may be any appropriate rigid board that has interconnection sites on both sides. Support substrate 57 is preferably a standard epoxy printed wiring board. The term rigid in the context of this prescription is intended to mean any board structure with rigidity greater than that of the flexible substrate 51. The support substrate 57 adds a second level of interconnection, and has through hole interconnections (not shown) for interconnecting the multiple chips 53 to the ball grid array (BGA) shown at 59. IC chip 55 is interconnected to the BGA by the printed circuit on the lower surface of the flexible substrate 51. The BGA is connected to the next board level. The advantage of having a large pitch at this level in the package is that support substrate 57 can be flip-bonded to a printed wiring board using large BGA solder bumps or balls. Large solder interconnections are very reliable and can be made with high yield. The solder bump sites on the flexible substrate 51 are preferably pads incorporated in the copper printed circuits and the solder bumps can be soldered directly to the copper pads.

The support substrate 57 is provided with openings 58 to accommodate the IC chips mounted on the underside of the flexible substrate.

It is evident in the arrangement of FIG. 5 that the footprint of the IC chips mounted on the underside of the flexible substrate is constrained by the openings in the support substrate. However, typical expoxy printed wiring boards, e.g. FR4 boards, have sufficient structural integrity that a large percentage of the board area can be provided with openings such as opening 58. It is also evident from FIG. 5 that the number and arrangement of IC chips on the top surface of flexible substrate 51 is unconstrained.

As shown in FIG. 5, the IC array with the larger footprint will be mounted on the top side of the flexible substrate, where the footprint may exceed the area of the openings in the support substrate 57. Where the multi-chip package contains memory and logic chips, it is preferred that the memory chips be mounted on one side of the flexible substrate, where interconnections between memory chips, especially the $V_{DD}$ and $V_{SS}$ busses, are conveniently accommodated, and the IC logic chips mounted on the other side of the flexible substrate. The memory chip array will typically be the larger array and thus mounted, in the arrangement of FIG. 5, on the side of the flexible substrate that is unconstrained, i.e. is not bonded to the support substrate.

From the variety of designs described above it should be evident that other permutations of package designs in addition to those described are possible. Among these are MCM packages with:

1. Flip-chip bonded or surface mount chip(s) on the top of the substrate with flip-chip bonded chip(s) in the BGA gap.
2. Wire bonded chip(s) on the top of the substrate with wire bonded chip(s) in the BGA gap.
3. Wire bonded chip(s) in the BGA gap with flip-chip or surface mount chip(s) on the top of the substrate.

In each case the mounting of one or more IC chips on both sides of a support substrate is the main criterion of the MCM package.

For a robust IC package, the cavity occupied by IC chips 31–34 in FIG. 3 may be underfilled with an epoxy if desired, as shown at 37, and the IC chip 21 may be overmolded with plastic, as shown at 38, or otherwise enclosed as required by the application. In FIG. 5, underfill is represented by 61 and an overmolding at 62.

According to a main feature of the invention, a test strategy is used wherein one or more IC chips are mounted on one side of the substrate, and thoroughly tested. The partially packaged MCMs that pass this test are then completed by mounting IC chips on the other side of the substrate. These IC chips have been pretested and are KGD. The invention will be described more specifically for the MCM package of FIG. 3.

In this example it is assumed that IC chip 21 has relatively low value and relatively high probability of failure. This IC chip is permanently bonded, i.e. wire bonded, to substrate 22 to produce a partially completed MCM package (PCMP). The PCMP is then tested by whatever test is needed to ensure a fully functional PCMP. Overmolding 38 may be applied prior to testing. PCMPs that pass the test are then completed by assembling additional IC chips on the PCMP. In the broadest context, the additional IC chips may be located on either side of the substrate. In cases where the added IC chips are located on the same side as the IC chip or chips of the PCMP, the overmolding 38 is applied last. In the preferred form of the invention, all of the IC chip or chips to be located on a first side of the substrate are part of the PCMP, and are permanently mounted prior to testing. The MCM is completed by mounting the IC chips, e.g. IC chips 31–34, on the second side of the substrate, and solder bump bonding the substrate 22 to motherboard 26. IC chips 31–34 are KGD.

The test strategy of the invention is especially useful where the IC chips that are mounted after testing the PCMP are more costly than the IC chip 21. In the embodiment shown in FIG. 5, the IC chip 55 may be attached to form the PCMP, with IC chips 53 attached after testing the PCMP. In this case the invention is advantageous when the IC chips 53 (KGD) are more costly than IC chip 55. The higher cost may in some cases be attributed to the high cost of burn-in and other testing. For some IC chips, testing at the wafer level is considered prohibitive for one or more reasons, and these chips are necessarily packaged prior to testing.

It should be understood that while the test strategy is focused mainly on IC chips, other components, e.g. resistors and capacitors, may be included in addition to a high risk IC chip.

The substrate 22 in FIG. 3 is typically an epoxy laminate printed wiring board. However, as is evident from the arrangement of FIG. 5, other substrates may be used. Silicon interconnection substrates, with through hole interconnections provided, are useful for high performance MCMs. The support substrate, or motherboard, for example substrate 26 of FIG. 3, is typically an epoxy laminate although, again, other substrates may be found useful.

Prior U.S. Pat. Nos. 5,898,223, 5,646,828, and 5,990,564, and U.S. application Ser. No. 09/435,971, filed Nov. 8, 1999 contain MCM package details that supplement those given here and all are incorporated herein by reference.

The electrical test procedure itself is conventional and comprises the steps of applying test input signal(s) to the appropriately powered PCMP, measuring the output signal (s) or responses, comparing the response signal(s) to a set of predetermined output signal(s), and selecting those IC devices with response signal(s) that meet said set of predetermined output signal(s). As will be understood by those skilled in the art the steps of measuring, comparing and selecting are carried out by automated software driven means.

For burn-in tests to produce KGD used to complete the PCMPs, the devices are typically exposed to an elevated temperature, e.g. 85–125° C., prior to and during measurement.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. A method for the manufacture of multi-chip modules (MCM) wherein each MCM comprises a first IC chip and a second IC chip comprising the steps of:

fabricating a plurality of partially completed MCM packages (PCMP), each PCMP fabricated by permanently attaching the first MCM chip to the substrate, electrically testing the functionality of the plurality of PCMPs, selecting the PCMPs that pass the test as known good PCMPs (KGPCMPs)

permanently attaching the second IC chip to the KGPCMP substrate.

2. The method of claim 1 wherein the first IC chip is one of a plurality of IC chips.

3. The method of claim 2 wherein the substrate has:

a. a top side, b. a bottom side, c. a first printed circuit on the top side, d. a second printed circuit on the bottom side, and e. via interconnections interconnecting the printed circuit on the top side and the printed circuit on the bottom side, and wherein the method comprises the additional steps of:

permanently attaching the plurality of IC chips to the top side of the substrate and interconnecting the top side IC chip to the first printed circuit, permanently attaching the second IC chip to the bottom side of each KGPCMP substrate and interconnecting the bottom side IC chip to the second printed circuit.

4. The method of claim 3 wherein the PCMPs are electrically tested by contacting the second printed circuit.

5. The method of claim 3 wherein the bottom side IC chips are known good die (KGD).

6. The method of claim 3 wherein the substrate is solder bump bonded to a motherboard.

7. The method of claim 6 wherein the top side of the substrate is bonded to the motherboard.

8. The method of claim 6 wherein the bottom side of the substrate is bonded to the motherboard.

9. The method of claim 3 wherein the step of electrically testing comprises producing an output electrical signal responsive to one or more input electrical signals.

10. The method of claim 3 wherein the top side IC chip is attached to the substrate by wire bonds.

11. The method of claim 3 wherein the top side IC chips are attached to the substrate by solder bumps.

12. The method of claim 5 wherein the KGD are pretested by a burn-in test.

13. The method of claim 3 wherein the substrate is an epoxy laminate.

14. The method of claim 3 wherein the substrate is silicon.

* * * * *